(12) United States Patent
Nakamura et al.

(10) Patent No.: US 6,400,618 B1
(45) Date of Patent: Jun. 4, 2002

(54) SEMICONDUCTOR MEMORY DEVICE WITH EFFICIENT REDUNDANCY OPERATION

(75) Inventors: Toshikazu Nakamura; Yoshinori Okajima, both of Kawasaki; Hiroyuki Sugamoto, Kasugai, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/722,472

(22) Filed: Nov. 28, 2000

(30) Foreign Application Priority Data

Aug. 2, 2000 (JP) ........................................ 2000-234844

(51) Int. Cl.[7] ................................................ G11C 7/00
(52) U.S. Cl. ............... 365/200; 365/225.7; 365/230.06; 365/230.03
(58) Field of Search ................................. 365/200, 201, 365/225.7, 230.01, 230.03, 230.06

(56) References Cited

U.S. PATENT DOCUMENTS

| | | | | |
|---|---|---|---|---|
| 5,206,831 A | * | 4/1993 | Wakamatsu | ................. 365/200 |
| 5,457,655 A | * | 10/1995 | Savignac et al. | ............ 365/200 |
| 5,498,975 A | * | 3/1996 | Cliff et al. | ...................... 326/10 |
| 6,137,735 A | * | 10/2000 | Wei et al. | .................... 365/200 |
| 6,144,577 A | * | 11/2000 | Hidaka | .......................... 365/63 |
| 6,201,744 B1 | * | 3/2001 | Takahashi | ................... 365/200 |

FOREIGN PATENT DOCUMENTS

| | | | |
|---|---|---|---|
| JP | 402105399 A | * | 4/1990 |
| JP | 407057495 A | * | 3/1995 |
| JP | 9-213096 | | 8/1997 |
| JP | 410188595 A | * | 7/1998 |
| JP | 2000-057797 | | 2/2000 |

* cited by examiner

*Primary Examiner*—Viet Q. Nguyen
(74) *Attorney, Agent, or Firm*—Arent Fox Kintner Plotkin & Kahn, PLLC

(57) ABSTRACT

A semiconductor memory device, comprising a fuse circuit which indicates a defective portion in a row direction, and also indicates the defective portion in a column direction, and a control circuit which switches data buses to avoid the defective portion indicated in the column direction by the fuse circuit when the defective portion indicated in the row direction by the fuse circuit corresponds to a row address that is input to the semiconductor memory device.

10 Claims, 10 Drawing Sheets

SEMICONDUCTOR MEMORY DEVICE WITH EFFICIENT REDUNDANCY OPERATION

BACKGROUND OF THE INVENTION

1. Field of the Invention

The present invention generally relates to semiconductor memory devices including a redundant cell array, and particularly relates to a semiconductor memory device including a redundant cell array having an improved efficiency of redundancy processing.

2. Description of the Related Art

Redundant cells are indispensable technology in semiconductor memory devices such as DRAMs (dynamic random access memories). As technology for increasing circuit density advances, many numbers of deficient cells are generated at incipient stages of related technologies. In such cases, deficient cells need to be replaced by numbers of redundant cells and redundancy circuits. As these technologies mature, however, the number of deficient cells decreases, resulting in the redundant cells being wasted as they are provided in excess numbers to meet the strong demand at the incipient stages. This means an increase of unusable and wasted chip areas.

As is pointed out above, many numbers of redundancy circuits are necessary at incipient stages of new technologies, but will be wasted as these technologies mature.

In conventional redundancy circuits, fuses are cut so that these fuses correspond to addresses of deficient bits, words, column selection lines, data bus lines, etc. When access to these addresses is attempted, the access is directed to redundant cells that have replaced the deficient elements.

Such a configuration is permanently fixed once the fuses are cut regardless of whether row redundancy or column redundancy is employed. In the case of column redundancy, for example, when a deficient column is replaced by a redundant cell array, any access to this column is treated as access to the redundant cell array without exception. In order to provide a redundancy mechanism for two columns, therefore, such a redundancy mechanism needs to have twice the size the redundancy mechanism for one column. This results in an increase of chip size.

Accordingly, there is a need for a semiconductor memory device which can cope with larger numbers of deficiencies without increasing the size of a redundant cell array by improving efficiency of redundancy operation.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor memory device including a fuse circuit which indicates a defective portion in a row direction, and also indicates the defective portion in a column direction, and a control circuit which switches data buses to avoid the defective portion indicated in the column direction by the fuse circuit when the defective portion indicated in the row direction by the fuse circuit corresponds to a row address that is input to the semiconductor memory device.

In the device as described above, the fuses specify the defective portion in the row direction and in the column direction, and it is decided based on the row address of access operation whether to switch to redundant cells, i.e., whether to engage in column redundancy operation. This achieves efficient redundancy processing.

DESCRIPTION OF THE PREFERRED EMBODIMENTS

In the following, embodiments of the present invention will be described with reference to the accompanying drawings.

FIGS. 1A through 1C are illustrative drawings for explaining a principle of redundancy operation according to the present invention.

In the present invention, fuses indicate positions of deficiencies in a column direction and in a row direction, and it is decided based on a row address of access operation whether to switch to redundant cells, i.e., whether to engage in column redundancy operation.

Figure 1:
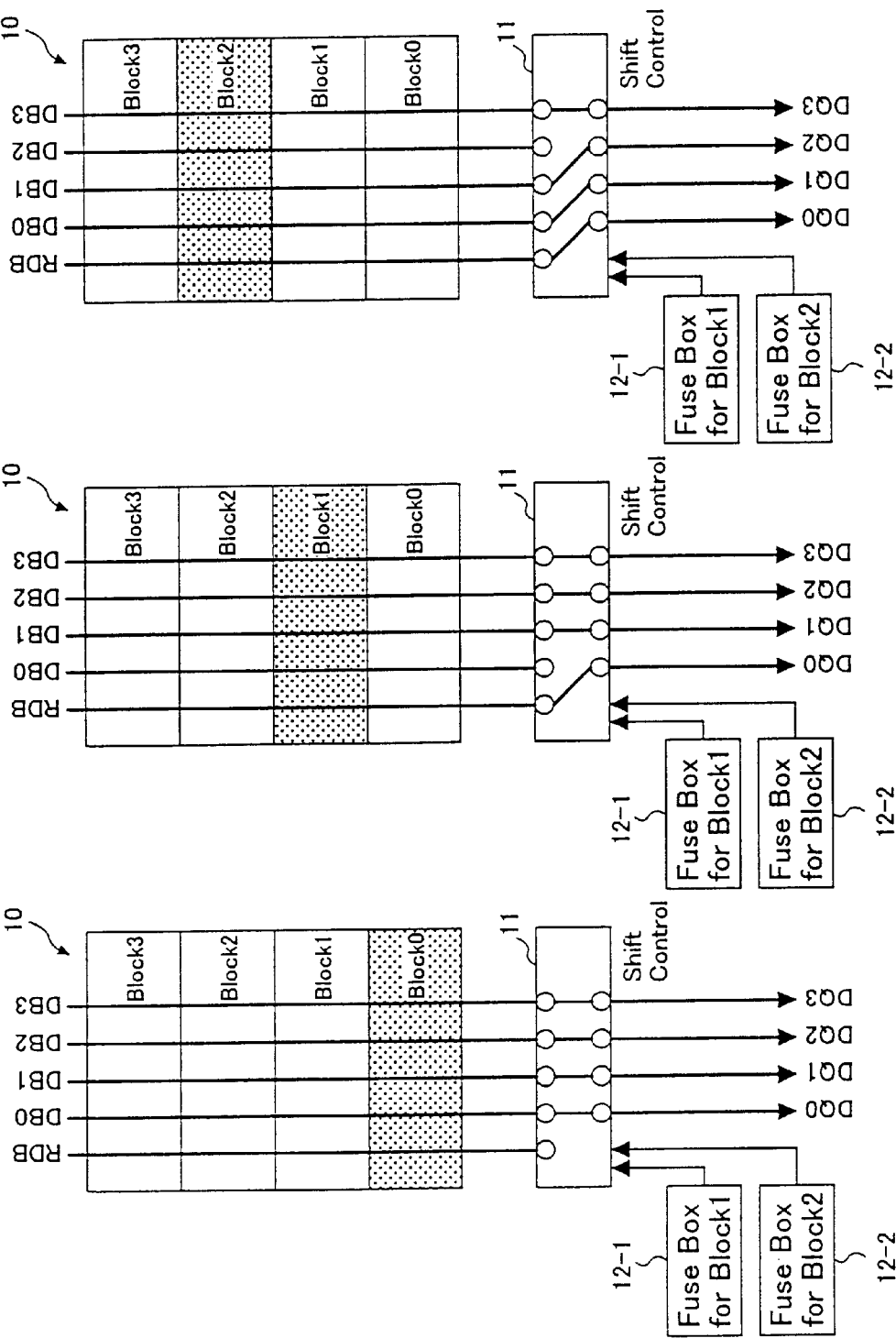
FIGS. 1A through 1C are illustrative drawings for explaining a principle of redundancy operation according to the present invention.

As shown in FIGS. 1A through 1C, the present invention includes a memory core circuit 10, a shift-control circuit 11, and fuse circuits 12-1 and 12-2. Data-read operation or data-write operation is performed with respect to the memory core circuit 10 via data buses DB0 through DB3. In the memory core circuit 10, a set of redundant cells is provided, and corresponds to a data bus RDB. The fuse circuits 12-1 and 12-2 serve to indicate positions of deficiencies in a column direction as well as in a row direction based on fuse-cut conditions thereof. In the example of FIG. 1, for example, the fuse circuit 12-1 indicates presence of a deficiency along the data bus DB0 in a block Block1 in the row direction. Further, the fuse circuit 12-2 indicates presence of a deficiency along the data bus DB2 in a block Block2 in the row direction. Here, the terminology "block" refers to each of the areas that are obtained by dividing the memory core circuit 10 in the row-address direction, and correspond to a unit by which a portion of the circuit such as sense amplifiers is activated. When access is made to a given block, generally, circuit elements such as sense amplifiers are activated only if these elements are relevant to the given block.

In data-read operation or data-write operation, when access to the memory core circuit 10 is made, the row address of the access operation is referred to in order to determine whether to switch to the redundant cells. FIG. 1A shows a case in which access is made to the block Block0. In this case, the row address of the access operation points to the block Block0, so that no column-redundancy operation is engaged in. In the case of data-read operation, for example, data on the data buses DB0 through DB3 are read as data DQ0 through DQ3.

FIG. 1B shows a case in which access is made to the block Block1. In this case, the row address of the access operation points to the block Block1 that is indicated by the fuse circuit 12-1, so that the data bus DB0 indicated by the fuse circuit 12-1 is subjected to column-redundancy operation, with access being switched to the redundant cells. Namely, in the case of data-read operation, for example, the redundant cells replace the data bus DB0, so that data on the data buses RDB, DB1, DB2, and DB3 are read as data DQ0 through DQ3.

FIG. 1C shows a case in which access is made to the block Block2. In this case, the row address of the access operation points to the block Block2 that is indicated by the fuse circuit 12-2, so that the data bus DB2 indicated by the fuse circuit 12-2 is subjected to column-redundancy operation, with access being switched to the redundant cells. Namely, in the case of data-read operation, for example, the redundant cells replace the data bus DB2, so that data on the data buses RDB, DB0, DB1, and DB3 are read as data DQ0 through DQ3.

In this manner, the present invention uses fuses to indicate positions of deficiencies in the column direction and in the row direction, and it is determined based on the row address of access operation whether to switch to the redundant cells, i.e., whether to engage in column-redundancy operation. This achieves efficient redundancy processing.

In conventional configurations, once fuses are conditioned to subject the data bus DB0 to redundancy operation, access is always switched from the data bus DB0 to the redundant cells regardless of the row address of access operation. Accordingly, when deficiencies exist both along the data bus DB0 and along the data bus DB2 as shown in FIG. 1, two sets of redundant cells are necessary in order to save these two deficiencies. In the present invention, on the other hand, operation is controlled based on the row address of access operation with respect to whether to switch to the redundant cells. Therefore, one set of redundant cells can cope with deficiencies of a plurality of data buses.

In the following, embodiments of the present invention will be described with reference to the accompanying drawings.

Figure 2:
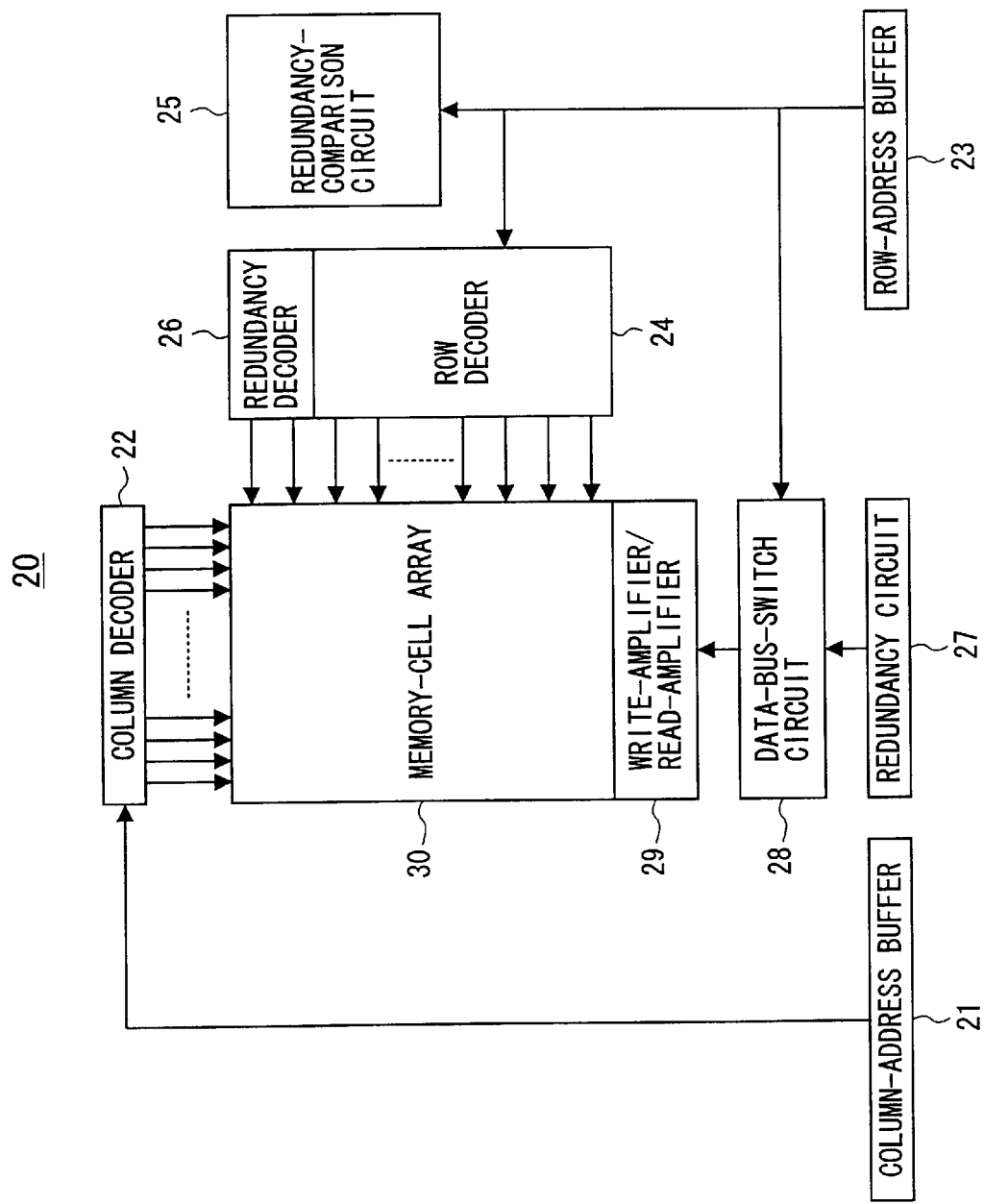
FIG. 2 is a block diagram of a semiconductor memory device to which the present invention is applied.

FIG. 2 is a block diagram of a semiconductor memory device to which the present invention is applied.

A semiconductor memory device 20 of FIG. 2 includes a column-address buffer 21, a column decoder 22, a row-address buffer 23, a row decoder 24, a redundancy-comparison circuit 25, a redundancy decoder 26, a redundancy circuit 27, a data-buss-witch circuit 28, a write-amplifier/read-amplifier 29, and a memory-cell array 30.

A row address that is input to the row-address buffer 23 is supplied to the row decoder 24. The row decoder 24 decodes the received row address, and accesses an indicated row address in the memory-cell array 30. The redundancy-comparison circuit 25 compares the row address with redundancy addresses. If there is a match, the redundancy decoder 26 accesses the redundant cells. This processing is directed to the row redundancy, and is different from the column-redundancy processing of the present invention.

A column address that is input to the column-address buffer 21 is supplied to the column decoder 22. The column decoder 22 decodes the receive column address, and accesses an indicated column address in the memory-cell array 30. Data-read operation or data-write operation with respect to the accessed address is then performed through the write-amplifier/read-amplifier 29.

The redundancy circuit 27 points to positions of deficiencies in the column direction and in the row direction based on fuse-cut conditions thereof. Based on the positions of deficiencies provided from the redundancy circuit 27 and the row address provided from the row-address buffer 23, the data-bus-switch circuit 28 redirects access from a data bus to a redundancy bus as described in connection with FIGS. 1A through 1C. In this manner, control as to whether to engage in redundancy operation on a block-by-block basis is achieved.

Figure 3:
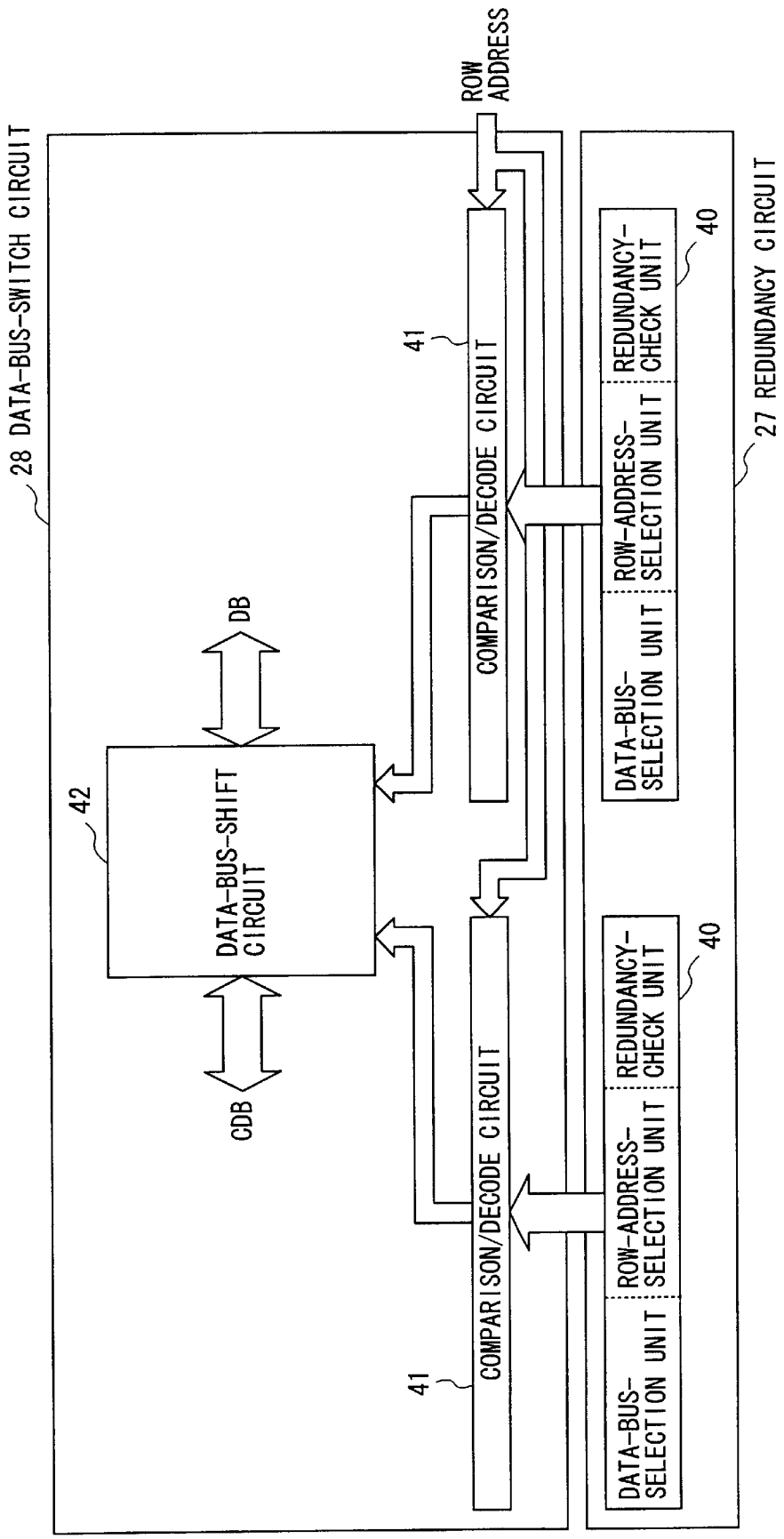
FIG. 3 is a block diagram showing a first embodiment of a edundancy circuit and a data-bus-switch circuit shown in FIG.2.

FIG. 3 is a block diagram showing a first embodiment of the redundancy circuit 27 and the data-bus-switch circuit 28.

As shown in FIG. 3, according to the first embodiment, the redundancy circuit 27 includes two 10 fuse circuits 40. Each of the fuse circuits 40 includes a data-bus-selection unit, a row-address-selection unit, and a redundancy-check unit.

The data-bus-switch circuit 28 includes two comparison/decode circuits 41 and a data-bus-shift circuit 42.

In what follows, details of each element shown in FIG. 3 will be described.

Figure 4:
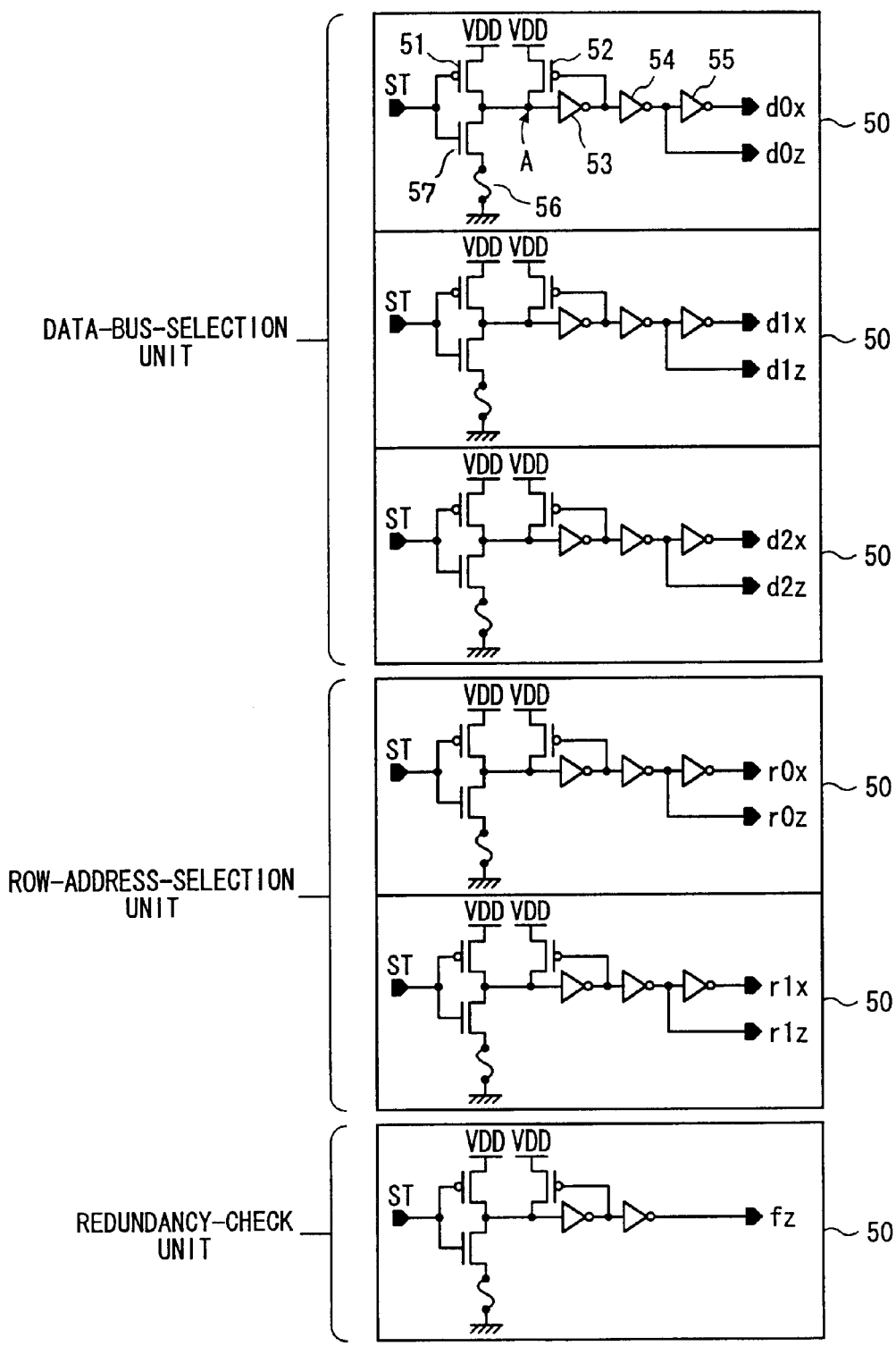
FIG. 4 is a circuit diagram showing a circuit structure of a fuse circuit shown in FIG. 3.

FIG. 4 is a circuit diagram showing a circuit structure of the fuse circuit 40. The fuse circuit 40 of FIG. 4 includes the data-bus-selection unit, the row-address-selection unit, and the redundancy-check unit, and each unit is comprised of one or more latch circuits 50. In FIG. 4, for the sake of simplicity of explanation, three latch circuits 50 are provided for three-bit selection of data buses, and two latch circuits 50 are provided for two-bit selection of row addresses. As for the redundancy-check unit, only one bit is necessary since this unit is used for checking whether or not to engage in redundancy processing.

A latch circuit 50 includes PMOS transistors 51 and 52, inverters 53 through 55, a fuse 56, and an NMOS transistor 57. A signal ST is LOW at the time of power on of the device, and becomes HIGH thereafter. As the signal ST becomes LOW at the time of power on of the device, a latch comprised of the inverter 53 and the PMOS transistor 52 latches a HIGH potential appearing at a node A.

When the fuse 56 is intact (i.e., not disconnected), the potential appearing at the node A drops to LOW as the signal ST becomes HIGH, and the LOW potential at the node A will be maintained thereafter. When the fuse 56 is disconnected in advance, the HIGH potential that the latch holds remains at the node A even when the signal ST becomes HIGH.

As described above, the latch circuit 50 latches different statuses, depending on whether the fuse 56 is intact or disconnected.

Accordingly, cutting proper fuses makes it possible to point to data buses and row addresses (row blocks) that suffer deficiency.

Figure 5:
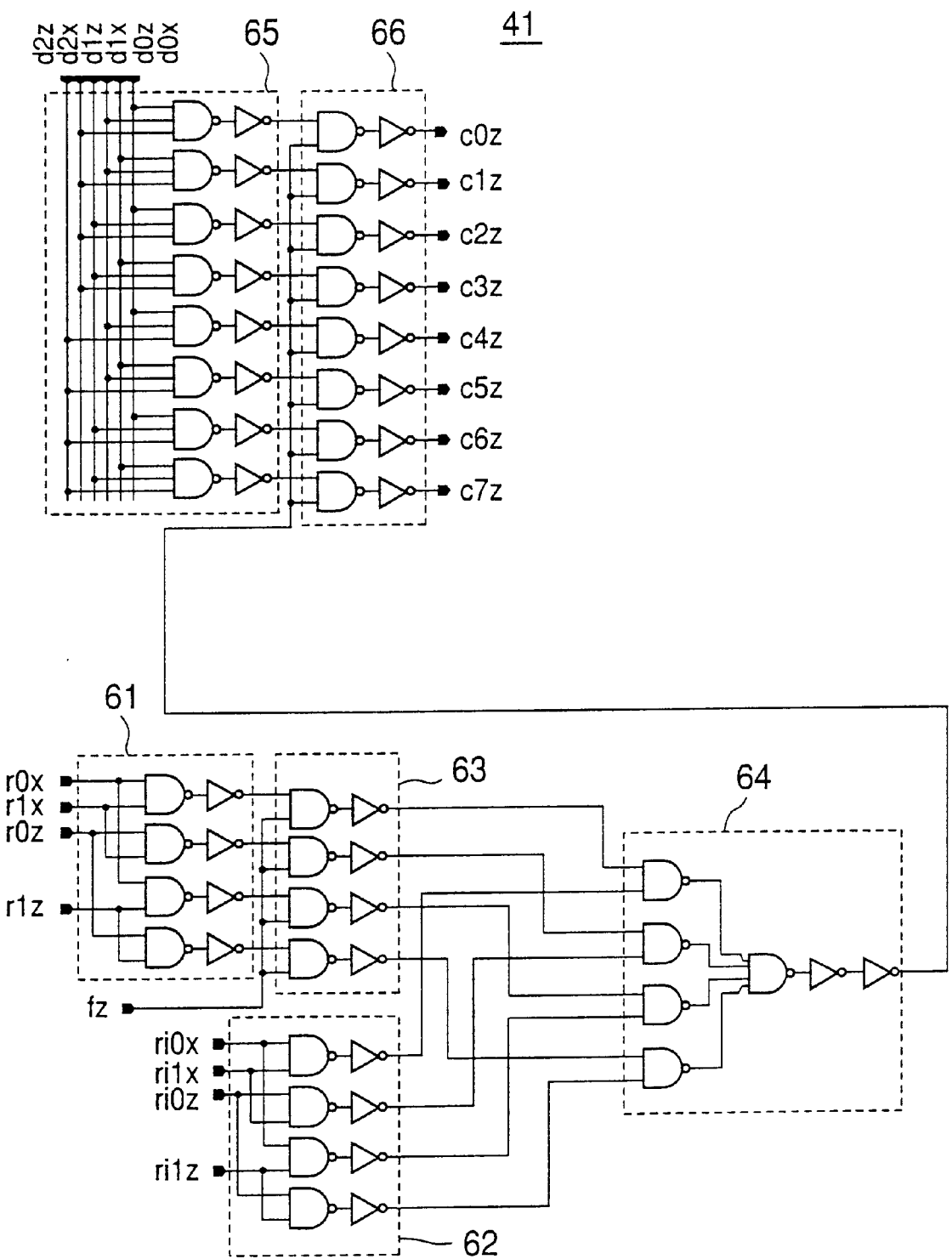
FIG. 5 is a circuit diagram showing a circuit structure of a comparison/decode circuit shown in FIG. 3.

FIG. 5 is a circuit diagram showing a circuit structure of the comparison/decode circuit 41.

The comparison/decode circuit 41 is comprised of a plurality of NAND circuits and a plurality of inverters, and includes a redundancy-row-address decoder 61, an input-row-address decoder 62, a redundancy-check gate 63, a row-address-comparison circuit 64, a redundancy-data-bus decoder 65, and a redundancy-control gate 66.

The redundancy-row-address decoder 61 receives row-address signals r0x, r0z, r1x, and r1z indicative of a defective row block from the row-address-selection unit of the fuse circuit 40 shown in FIG. 4. The redundancy-row-address decoder 61 decodes the received row address, and outputs the decoded signals. Here, a signal name ending with the alphabet letter z indicates that this signal is of a positive logic, and a signal name ending with the alphabet letter x indicates that this signal is of a negative logic. Accordingly, the signal r0x and the signal r0z are complementary with each other.

The redundancy-check gate 63 receives a signal fz from the redundancy-check unit of the fuse circuit 40 shown in FIG. 4 where the signal fz indicates whether to engage in redundancy operation. When the signal fz is HIGH, the redundancy-check gate 63 passes the decoded signals to the outputs thereof as these decoded signals are received from the redundancy-row-address decoder 61.

The input-row-address decoder 62 receives row-address signals ri0x, ri0z, ri1x, and ri1z, which are generated from a row address supplied from an exterior of the device. The input-row-address decoder 62 decodes the received row-address signals.

The decoded signals supplied from the redundancy-row-address decoder 61 through the redundancy-check gate 63 and the decoded signals supplied from the input-row-address decoder 62 are compared by the row-address-comparison circuit 64. If the decoded signals match, the row-address-comparison circuit 64 supplies a HIGH signal as an output thereof.

Namely, the row-address-comparison circuit 64 outputs the HIGH signal when the block indicated by the input row address matches the position of defect indicated by the fuse circuit.

The redundancy-data-bus decoder 65 receives data-bus-selection signals d0x, d0z, d1x, d1z, d2x, and d2z indicative of a defect data bus from the data-bus-selection unit of the fuse circuit 40 shown in FIG. 4. The redundancy-data-bus decoder 65 decodes the received date-bus-selection signals, and outputs the decoded signals.

The redundancy-control gate 66 receives from the row-address-comparison circuit 64 a signal indicative of whether the block pointed to by the input row address is a deficient block. If this signal is HIGH, the redundancy-control gate 66 passes the decoded signals from the redundancy-data-bus decoder 65 to the outputs thereof. The output signals in this case are data-bus-selection signals C0z through c7z. If the third data bus among the total of eight data buses suffers defect, for example, the data-bus-selection signal c2z is set to HIGH through settings made to the fuse circuit 40.

As described above, a given fuse circuit 40 indicates a single defect in the row direction and in the column direction. Based on the signals from the fuse circuit 40 and the input row-address signals, the comparison/decode circuit 41 points to a data bus that is to be connected to the redundant cells in response to the current row address.

In the configuration of FIG. 3, the two fuse circuits 40 are provided, so that a data bus to be connected to the redundant cells can be pointed to with respect to two different blocks. As is apparent, the number of fuse circuits 40 is not limited to two, and three or more fuse circuits 40 may be provided.

Figure 6:
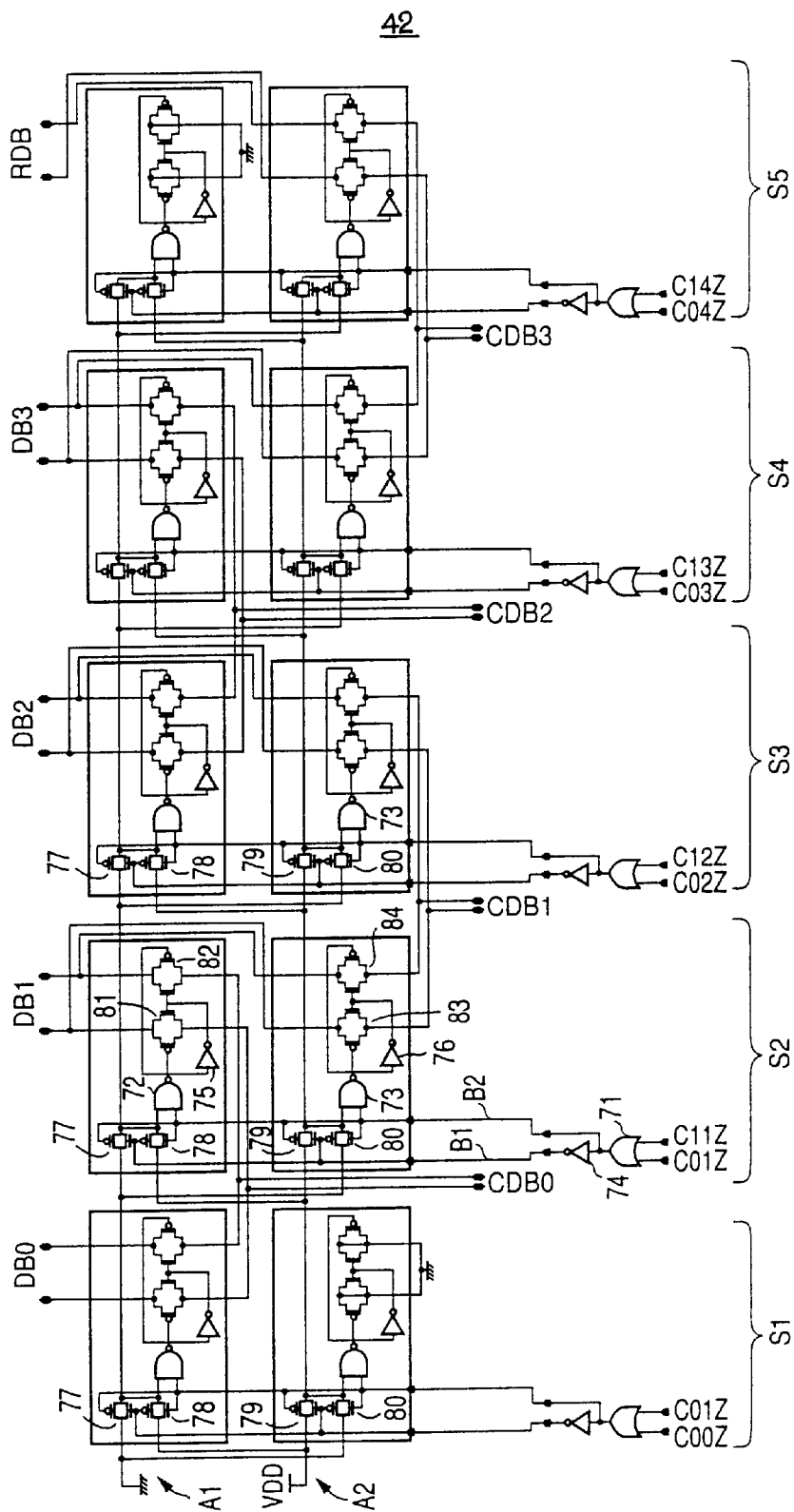
FIG. 6 is a circuit diagram showing a circuit structure of a data-bus-shift circuit shown in FIG. 3.

FIG. 6 is a circuit diagram showing a circuit structure of the data-bus-shift circuit 42.

The data-bus-shift circuit 42 serves to allocate data busses DB0 through DB3 and the redundancy data bus RDB provided on the side of the memory-cell array 30 to data buses CDB0 through CDB3 provided on the output side. The data-bus-shift circuit 42 receives the data-bus-selection signals c0z through c4z from the comparison/decode circuit 41 of FIG. 5.

In FIG. 6, the data-bus-shift circuit 42 is shown as having a four-bit configuration rather than a 8-bit configuration for the lack of space on the drawing sheet. Further, the data-bus-selection signals c0z through c4z supplied from one of the two comparison/decode circuits 41 shown in FIG. 3 are denoted as c00z through c04z, and the data-bus-selection signals c0z through c4z supplied from the other one of the two comparison/decode circuits 41 shown in FIG. 3 are denoted as c10z through c14z.

The data-bus-shift circuit 42 of FIG. 6 includes five switch circuits S1 through S5, which correspond to the data buses DB0 through DB3 and the redundancy data bus RDB, respectively. The switch circuits S1 and S5 provided at either end have a slightly different configuration than the switch circuits S2 through S4 provided therebetween. This difference, however, is only with respect to layouts of wires, and circuit elements involved therein are identical.

The switch circuit S2, for example, includes a NOR circuit 71, NAND circuits 72 and 73, inverters 74 through 76, and transfer gates 77 through 84. The transfer gates 77 through 84 are each comprised of a PMOS transistor and an NMOS transistor.

When a data bus corresponding to the switch circuit S2 is not pointed to, the data-bus-selection signals c01z and c11z are LOW, so that a signal on a signal line B1 is LOW whereas a signal on a signal line B2 is HIGH. When the adjacent data-bus-selection signals C00z and c10z are also LOW, the power-supply voltage VDD at a node A2 shown on the left-hand side of the figure is supplied to the NAND circuit 73 via the transfer gate 78 of the switch circuit S1 and the transfer gate 80 of the switch circuit S2. Further, the ground voltage at a node A1 is supplied to the NAND circuit 72 via the transfer gate 80 of the switch circuit S1 and the transfer gate 78 of the switch circuit S2. As a result, the output of the NAND circuit 73 becomes LOW so as to open the transfer gates 83 and 84, whereas the output of the NAND circuit 72 becomes HIGH so as to close the transfer gates 81 and 82. in this case, therefore, the data bus DB1 is electrically connected to the output-side data bus CDB1.

When the data bus corresponding to the switch circuit S2 is pointed to, either one of the data-bus-selection signals c01z and c11z is HIGH, so that the signal on the signal line B1 is HIGH whereas the signal on the signal line B2 is LOW. Since the NAND circuits 72 and 73 receive a LOW signal at one input thereof, they produce a HIGH output. Accordingly, the transfer gates 81 and 82 as well as the transfer gates 83 and 84 are all closed, thereby disconnecting the data bus DB1 from the output side as the data bus DB1 is defective in this case.

In this case, the adjacent data-bus-selection signals c00z and c10z are bound to be LOW, so that the power-supply voltage VDD at the node A2 shown on the left-hand side of the figure is supplied to the switch circuit S3 via the transfer gate 78 of the switch circuit S1 and the transfer gate 77 of the switch circuit S2. In the switch circuit S3, this power-supply voltage (VDD) is supplied to the NAND circuit 73 via the transfer gate 80. As a result, the data bus DB2 is electrically connected to the output-side data bus CDBL.

All the switch circuits S1 through S5 carry out the same operation as described above, thereby achieving the shifting of data buses as shown in FIG. 1.

Figure 7:
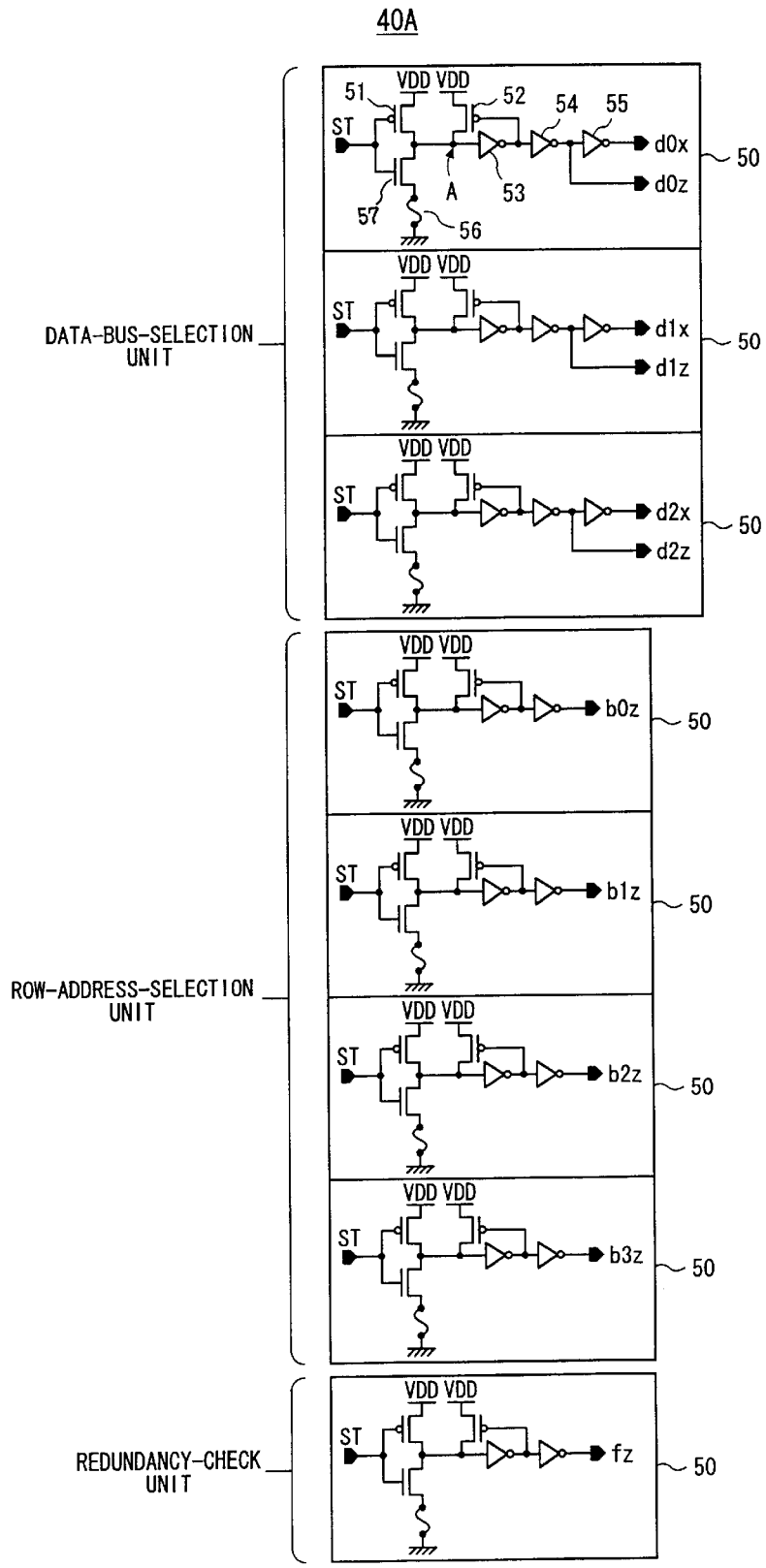
FIG. 7 is a circuit diagram showing a circuit structure of a second embodiment of the fuse circuit.

FIG. 7 is a circuit diagram showing a circuit structure of a second embodiment of the fuse circuit.

A fuse circuit 40A of FIG. 7 includes a data-bus-selection unit, a row-address-selection unit, and a redundancy-check unit, and each unit is comprised of one or more latch circuits 50 having an identical circuit structure. The configuration of FIG. 7 differs from the configuration of FIG. 4 only in the number of latch circuits 50 provided in the row-address-selection unit. In the second embodiment shown in FIG. 7, the fuse circuits specify a row address in an already decoded status thereof. Because of this, the four latch circuits 50 of the row-address-selection unit can point to a block selected from four different blocks.

Figure 8:
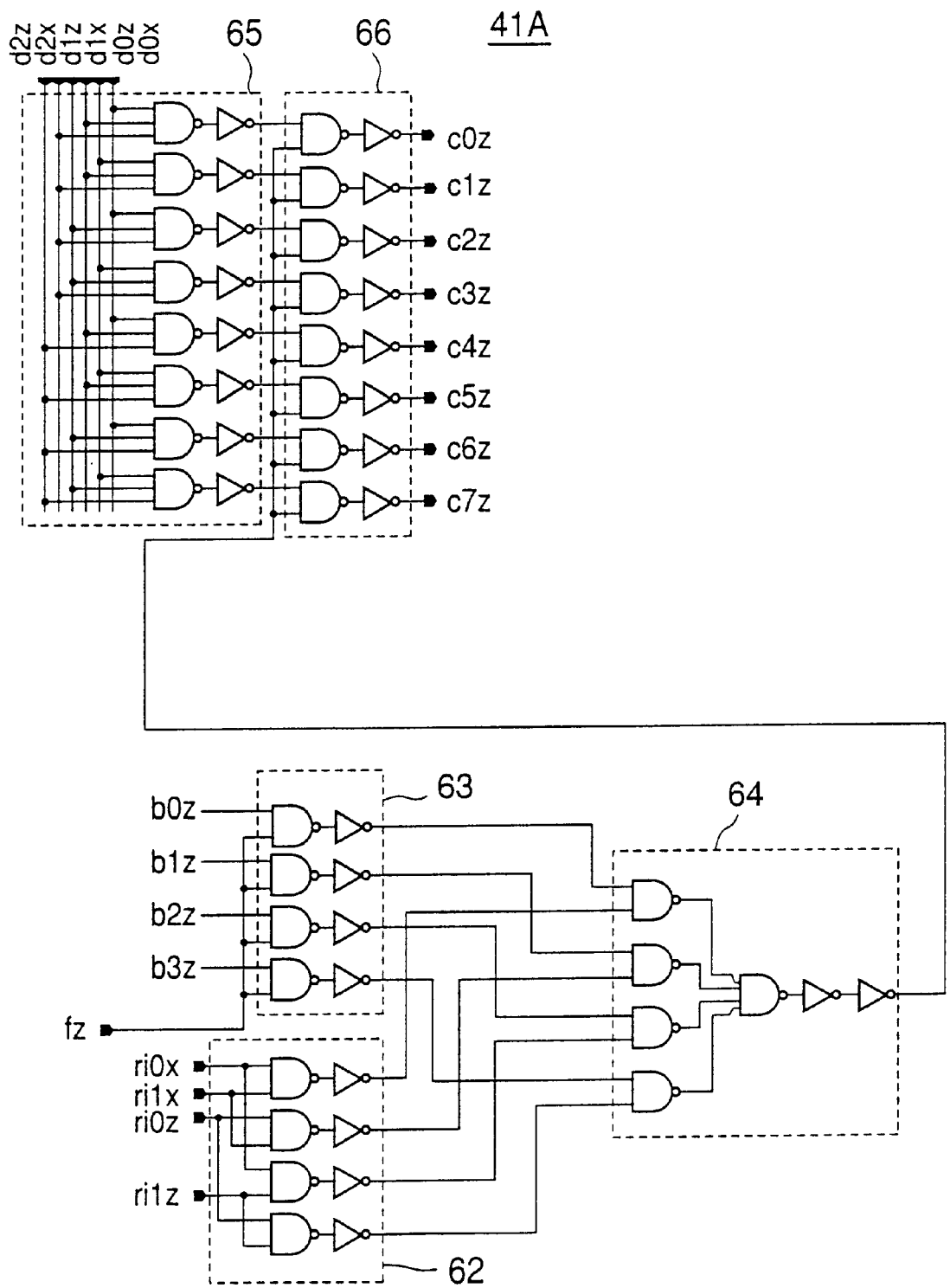
FIG. 8 is a circuit diagram showing a circuit structure of a second embodiment of the comparison/decode circuit.

FIG. 8 is a circuit diagram showing a circuit structure of a second embodiment of the comparison/decode circuit.

In a comparison/decode circuit 41A of FIG. 8, the redundancy-row-address decoder 61 is removed compared to the configuration of FIG. 5. Further, the redundancy-check gate 63 receives signals b0z, b1z, b2z, and b3z from the row-address-selection unit of the fuse circuit 40A shown in FIG. 7.

In the second embodiment as described above, the number of latch circuits 50 provided in the row-address-selection unit is increased in the fuse circuit, while the redundancy-row-address decoder 61 is removed from the comparison/decode circuit.

Figure 9:
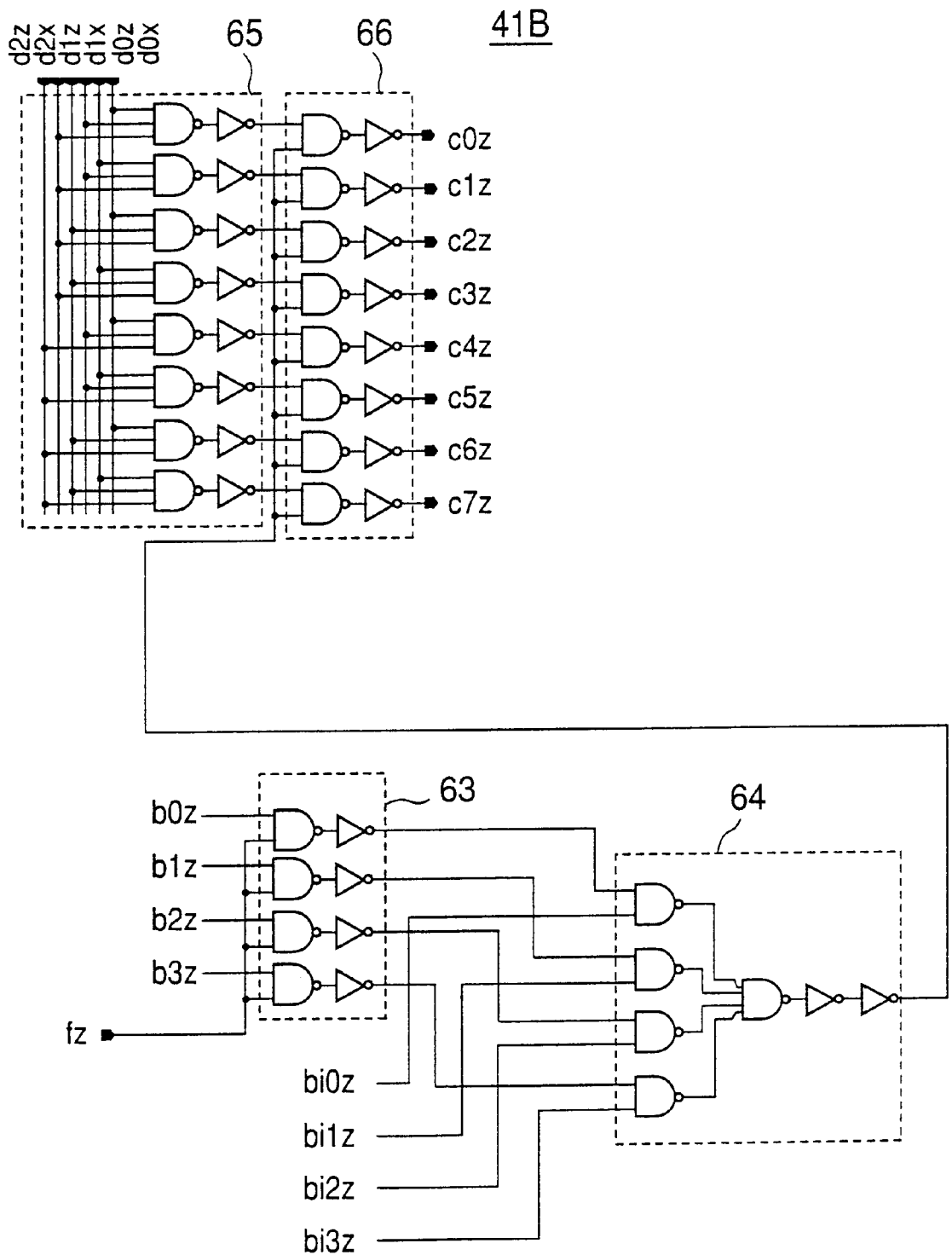
FIG. 9 is a circuit diagram showing a circuit structure of a third embodiment of the comparison/decode circuit.

FIG. 9 is a circuit diagram showing a circuit structure of a third embodiment of the comparison/decode circuit.

In a comparison/decode circuit 41B of FIG. 9, the input-row-address decoder 62 is further removed from the configuration of FIG. 8, and signals bi0z, bi1z, bi2z, and bi3z pointing to a block indicated by the input row address are directly supplied. In this configuration, there is no need to provide a signal-generation circuit in each comparison/decode circuit for the purpose of generating the signals bi0z, bi1z, bi2z, and bi3z pointing to a block.

In the configurations shown in FIGS. 7 through 9, a single fuse circuit can indicate a plurality of blocks. In the fuse circuit of FIG. 4, a row address prior to decoding is specified by the fuses, so that only one row-address block can be indicated. In the fuse circuit of FIG. 7, on the other hand, the fuses specify a decoded row address, i.e., a block number, so that disconnecting of more than one fuse results in more than one block being pointed to. Even in this case, however, only one data bus designation per fuse circuit is possible.

Figure 10:
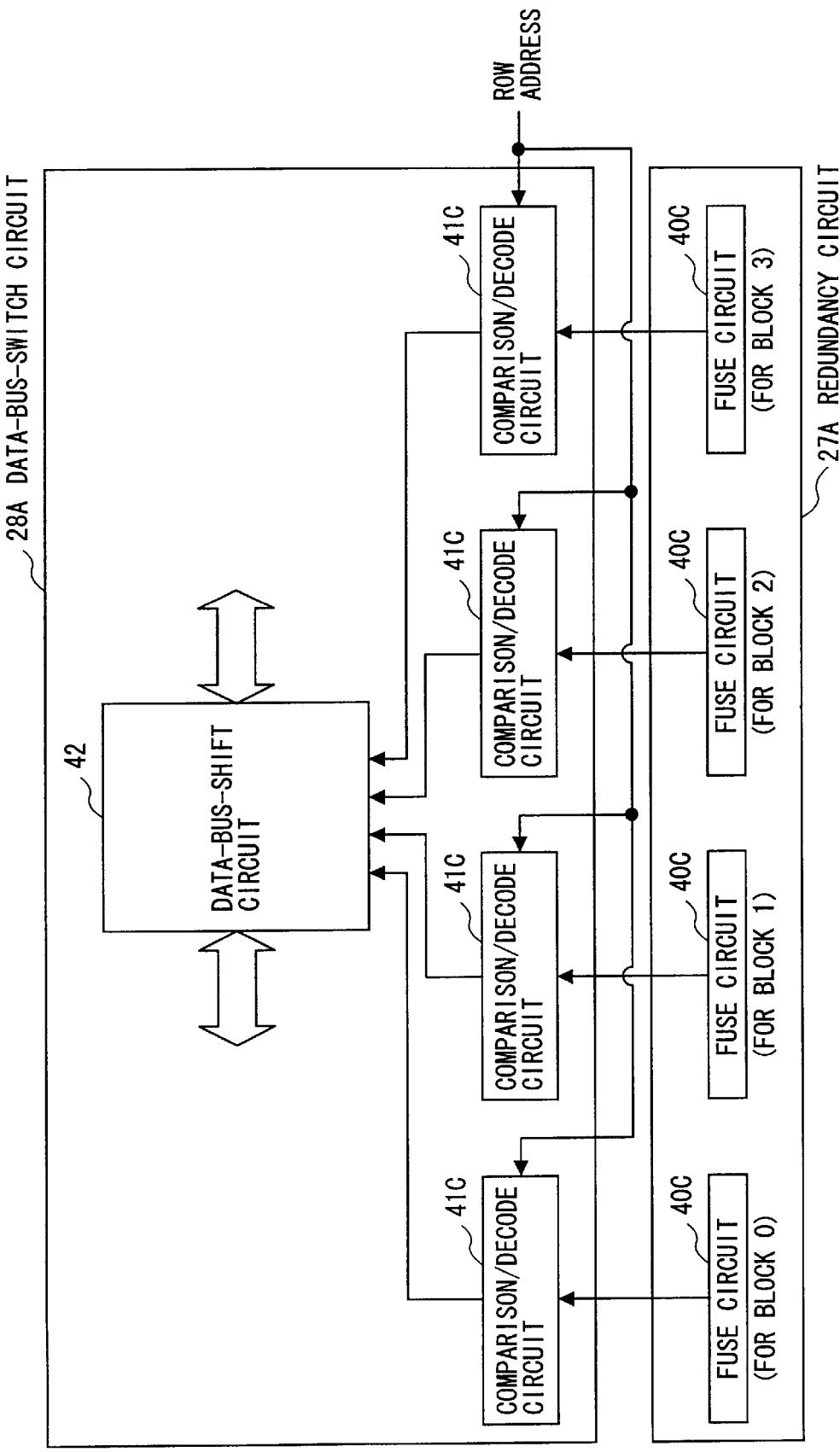
FIG. 10 is a block diagram showing a second embodiment of the redundancy circuit and the data-bus-switch circuit.

FIG. 10 is a block diagram showing a second embodiment of the redundancy circuit and the data-bus-switch circuit.

In the configuration of FIG. 10, a redundancy circuit 27A includes four fuse circuits 40C. A data-bus-switch circuit 28A includes four comparison/decode circuits 41C and the data-bus-shift circuit 42.

In the second embodiment, the four fuse circuits 40C are allocated to four respective blocks, which is a characteristic feature quite different from the first embodiment. There is no need for each of the fuse circuits 40C to individually point to a row address or a block. Namely, when a fuse circuit 40C corresponding to a block Block2 has a fuse thereof disconnected, and the data bus DB0 is pointed to as a defective data bus, the data bus DB0 in the block Block2 is treated as a defective portion.

In such a configuration, each of the fuse circuit 40C does not need a row-address-selection unit any longer. A given comparison/decode circuit 41C may be configured such that a gate signal supplied to the redundancy-control gate 66 as shown in FIG. 5 is changed to HIGH when a received row address corresponds to the row address allocated to this comparison/decode circuit 41C. Namely, in the comparison/decode circuit 41C corresponding to the fuse circuit 40C for the block Block2, a logic circuit is provided to generate a signal that becomes HIGH when a received row address corresponds to the block Block2. The output of this logic circuit is supplied to the redundancy-control gate 66 as a gate signal. Alternatively, each comparison/decode circuit 41C may be configured to receive decoded raw address signals. This eliminates a need for a decoding function in the comparison/decode circuit 41C.

In such a configuration as described above, the row-address-selection unit can be removed from the fuse circuit, and an excessive decode circuit can be removed from the comparison/decode circuit.

In the present invention as described above, fuses specify a defective portion in a row direction and in a column direction, and it is decided based on the row address of access operation whether to switch to redundant cells, i.e., whether to engage in column redundancy operation. This achieves efficient redundancy processing.

In conventional configurations, once fuses are conditioned to subject a data bus to redundancy operation, access is always switched from this data bus to redundant cells regardless of the row address of access operation. Accordingly, when deficiencies exist along two different data buses, two sets of redundant cells are necessary in order to save these two deficiencies. In the present invention, on the other hand, operation is controlled based on the row address of access operation with respect to whether to switch to the redundant cells. Therefore, one set of redundant cells can cope with deficiencies of a plurality of data buses.

Further, the present invention is not limited to these embodiments, but various variations and modifications may be made without departing from the scope of the present invention.

The present application is based on Japanese priority application No. 2000-234844 filed on Aug. 2, 2000, with the Japanese Patent Office, the entire contents of which are hereby incorporated by reference.

What is claimed is:

1. A semiconductor memory device, comprising:
   a fuse circuit which indicates a defective portion in a row direction, and also indicates the defective portion in a column direction, and
   a control circuit which switches data buses to avoid the defective portion indicated in the column direction by said fuse circuit when the defective portion indicated in the row direction by said fuse circuit corresponds to a row address that is input to said semiconductor memory device.

2. The semiconductor memory device as claimed in claim 1, wherein said control circuit includes a data-bus-switch circuit which selectively connects at least a first data bus of said data buses to a redundancy data bus, avoiding the defective portion indicated in the column direction by the fuse circuit.

3. The semiconductor memory device as claimed in claim 1, wherein said fuse circuit indicates the defective portion in the row direction by specifying a decoded row address through fuse-cut conditions.

4. The semiconductor memory device as claimed in claim 3, wherein the decoded row address specified by said fuse circuit corresponds to a block by which activation is controlled in a row address direction.

5. The semiconductor memory device as claimed in claim 1, wherein said fuse circuit includes a plurality of fuse circuits corresponding to respective defective portions.

6. The semiconductor memory device as claimed in claim 1, wherein said fuse circuit includes a plurality of fuse circuits corresponding to respective defective data buses, each of said fuse circuits indicating a defective portion in the row direction by specifying a decoded row address through fuse-cut conditions, so that said plurality of fuse circuits are capable of specifying a plurality of decoded row addresses.

7. The semiconductor memory device as claimed in claim 1, wherein said fuse circuit includes a plurality of fuse circuits as many as there are blocks each serving as a unit by which activation is controlled in a row-address direction, each of said fuse circuits indicating a defective portion in the row direction by association thereof with a corresponding one of the blocks, each of said fuse circuits specifying a defective portion in the column direction through fuse-cut conditions.

8. The semiconductor memory device as claimed in claim 1, wherein said fuse circuit includes a data-bus-selection unit configured to indicate the defective portion in the column direction, a row-address-selection unit configured to indicate the defective portion in the row direction, and a redundancy-check unit configured to indicate whether to engage in redundancy operation.

9. The semiconductor memory device as claimed in claim 8, the data-bus-selection unit, the row-address-selection unit, and the redundancy-check unit include latch circuits, each of which has a latch status thereof varying depending on fuse-cut conditions.

10. A semiconductor memory device comprising a control circuit which switches between engaging in redundancy operation in a column direction and refraining from redundancy operation depending on whether an input row address warrants the redundancy operation.

* * * * *